(12) United States Patent
Derkacs

(10) Patent No.: US 11,107,940 B2
(45) Date of Patent: Aug. 31, 2021

(54) MULTIJUNCTION SOLAR CELLS HAVING A GRADED-INDEX STRUCTURE

(71) Applicant: SolAero Technologies Corp., Albuquerque, NM (US)

(72) Inventor: Daniel Derkacs, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 13 days.

(21) Appl. No.: 16/710,922

(22) Filed: Dec. 11, 2019

(65) Prior Publication Data

US 2020/0119213 A1   Apr. 16, 2020

Related U.S. Application Data

(63) Continuation-in-part of application No. 16/167,110, filed on Oct. 22, 2018, now Pat. No. 10,559,705, (Continued)

(51) Int. Cl.
*H01L 31/054* (2014.01)
*H01L 31/0687* (2012.01)

(52) U.S. Cl.
CPC ...... *H01L 31/0547* (2014.12); *H01L 31/0549* (2014.12); *H01L 31/0687* (2013.01); *H01L 31/06875* (2013.01)

(58) Field of Classification Search
CPC ..... H01L 31/00; H01L 31/02; H01L 31/0232; H01L 31/02327; H01L 31/0687; H01L 31/06875; H01L 31/054; H01L 31/0549
See application file for complete search history.

(56) References Cited

U.S. PATENT DOCUMENTS

2006/0144435 A1 * 7/2006 Wanlass ............. H01L 31/0687
136/249
2010/0147366 A1 * 6/2010 Stan .................... H01L 31/0725
136/255
(Continued)

FOREIGN PATENT DOCUMENTS

CN   110491957 A   11/2019
CN   110 534 612 A   12/2019

OTHER PUBLICATIONS

European Search Report and Opinion for EP Patent Application No. 20152413.9 filed Jan. 17, 2020,11 pages.
(Continued)

*Primary Examiner* — Christina Chern

(57) ABSTRACT

A multijunction solar cells that include one or more graded-index structures disposed directly above the growth substrate beneath a base layer of a solar subcells. In some embodiments, the graded-index reflector structure is constructed such that (i) at least a portion of light of a first spectral wavelength range that enters and passes through a solar cell above the graded-index reflector structure is reflected back into the solar subcell by the graded-index reflector structure; and (ii) at least a portion of light of a second spectral wavelength range that enters and passes through the solar cell above the graded-index reflector structure is transmitted through the graded-index reflector structure to layers disposed beneath the graded-index reflector structure. The second spectral wavelength range is composed of greater wavelengths than the wavelengths of the first spectral wavelength range.

19 Claims, 5 Drawing Sheets

Related U.S. Application Data which is a continuation of application No. 15/495,524, filed on Apr. 24, 2017, now abandoned.

(60) Provisional application No. 62/391,752, filed on May 11, 2016.

(56) References Cited

U.S. PATENT DOCUMENTS

| | | | |
|---|---|---|---|
| 2015/0179857 A1* | 6/2015 | Lin | H01L 31/0725 136/255 |
| 2019/0280143 A1 | 11/2019 | Ding et al. | |
| 2019/0259897 A1 | 12/2019 | France et al. | |

OTHER PUBLICATIONS

Jiang Yajie et al.: "Design of an intermediate Bragg reflector within triple-junction solar cells for spectrum splitting applications", Solar Energy Material and Solar Cells, vol. 193, Jan. 23, 2019, p. 259-269, XP085596865.

Kurihara K et al.: "Determination of power reflectivity of quasi-graded distributed Bragg reflectors using stopband width", IEEE Photonics Technology Letters, vol. 5, No. 3, Mar. 1993, p. 333-336, XP011410773.

\* cited by examiner ns having a
MULTIJUNCTION SOLAR CELLS HAVING A GRADED-INDEX STRUCTURE

REFERENCE TO RELATED APPLICATIONS

This application is a continuation-in-part of U.S. patent application Ser. No. 16/167,110, filed Oct. 22, 2018, which is a continuation of U.S. patent application Ser. No. 15/495,524 filed Apr. 24, 2017, which in turn claims the benefit of U.S. Provisional Application No. 62/391,752, filed May 11, 2016, all of the above applications being herein incorporated by reference in their entirety.

BACKGROUND OF THE INVENTION

1. Field of the Invention

The present disclosure relates to solar cells and the fabrication of solar cells, and more particularly to multijunction solar cells having at least one semiconductor reflector structure under a subcell to reflect light in a predetermined wavelength band back into the subcell to thereby increase absorption in that subcell and overall solar cell efficiency.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided by the photovoltaic power system. Thus, as payloads become more sophisticated, weight or mass of the photovoltaic power system, and more particularly the power-to-weight ratio of the solar cells becomes increasingly more important, and there is increasing interest in lighter weight, "thin film" type solar cells having both high efficiency and low mass.

The efficiency of energy conversion, which converts solar energy (or photons) to electrical energy, depends on various factors such as the design of solar cell structures, the choice of semiconductor materials, and the thickness of each cell. In short, the energy conversion efficiency for each solar cell is dependent on the optimum utilization of the available sunlight across the solar spectrum by the subcells in a multijunction solar cell. As such, the characteristic of sunlight absorption in semiconductor material, also known as photovoltaic properties, is critical to determine the most efficient number and sequence of subcells, and the semiconductor material (with specific bandgap, thickness, and electrical properties) in each subcell, to achieve the optimum energy conversion.

Typical III-V compound semiconductor solar cells are fabricated on a semiconductor wafer in vertical, multijunction structures or tandem series-connected sequence of solar subcells, each subcell formed with appropriate semiconductor layers and including a p-n photoactive junction. Each subcell is designed to convert photons over different spectral or wavelength bands to electrical current. After the sunlight impinges on the front of the solar cell, and photons pass through the subcells, the photons in a wavelength band that are not absorbed and converted to electrical energy in the region of one subcell propagate to the next subcell, where such photons are intended to be captured and converted to electrical energy, assuming the downstream subcell is designed for the photon's particular wavelength or energy band.

A solar cell designed for use in a space vehicle (such as a satellite, space station, or an interplanetary mission vehicle), has a sequence of subcells with compositions and band gaps which have been optimized to achieve maximum energy conversion efficiency for the AM0 solar spectrum in space. The AM0 solar spectrum in space is notably different from the AM1.5 solar spectrum at the surface of the earth, and accordingly terrestrial solar cells are designed with subcell band gaps optimized for the AM1.5 solar spectrum.

The space solar cells and arrays experience a variety of complex environments in space missions, including the vastly different illumination levels and temperatures seen during normal earth orbiting missions, as well as even more challenging environments for deep space missions, operating at different distances from the sun, such as at 0.7, 1.0 and 3.0 AU (AU meaning astronomical units). The photovoltaic arrays also endure anomalous events from space environmental conditions, and unforeseen environmental interactions during exploration missions. Hence, electron and proton radiation exposure, collisions with space debris, and/or normal aging in the photovoltaic array and other systems could cause suboptimal operating conditions that degrade the overall power system performance, and may result in failures of one or more solar cells or array strings and consequent loss of power.

The radiation hardness of a solar cell is defined as how well the cell performs after exposure to the electron or proton particle radiation which is a characteristic of the space environment. A standard metric is the ratio of the end of life performance (or efficiency) divided by the beginning of life performance (EOL/BOL) of the solar cell. The EOL performance is the cell performance parameter after exposure of that test solar cell to a given fluence of electrons or protons (which may be different for different space missions or orbits). The BOL performance is the performance parameter prior to exposure to the particle radiation.

Charged particles in space could lead to damage to solar cell structures, and in some cases, dangerously high voltage being established across individual devices or conductors in the solar array. These large voltages can lead to catastrophic electrostatic discharging (ESD) events. Traditionally for ESD protection the backside of a solar array may be painted with a conductive coating layer to ground the array to the space plasma, or one may use a honeycomb patterned metal panel which mounts the solar cells and incidentally protects the solar cells from backside radiation.

The radiation hardness of the semiconductor material of the solar cell itself is primarily dependent on a solar cell's minority carrier diffusion length ($L_{min}$) in the base region of the solar cell (the term "base" region referring to the p type base semiconductor region disposed directly adjacent to an n+ type "emitter" semiconductor region, the boundary of which establishes the p-n photovoltaic junction). The less degraded the parameter $L_{min}$ is after exposure to particle radiation, the less the solar cell performance will be reduced. A number of strategies have been used to either improve $L_{min}$, or make the solar cell less sensitive to $L_{min}$ reductions. Improving $L_{min}$ has largely involved including a gradation in dopant elements in the semiconductor base layer of the subcells so as to create an electric field to direct minority carriers to the junction of the subcell, thereby effectively increasing $L_{min}$. The effectively longer $L_{min}$ will improve the cell performance, even after the particle radiation exposure. Making the cell less sensitive to $L_{min}$ reductions has involved increasing the optical absorption of the base layer such that thinner layers of the base can be used to absorb the same amount of incoming optical radiation.

Although there is a desire to increase efficiency of space solar cells at the "end-of-life", or simply put improving the "radiation hardness" of such solar cells, the known methods of utilizing distributed Bragg reflector (DBR) layers under certain subcells have their limitations and drawbacks, and there is a need for alternative solutions to the objective technical problem of increasing efficiency without such drawbacks.

The present disclosure proposes additional design features for multijunction solar cells capable of increasing the efficiency of the multijunction solar cell in converting solar energy (or photons) to electrical energy for space applications in radiation environments, especially at the end-of-life (EOL) phase.

SUMMARY OF THE DISCLOSURE

Objects of the Disclosure

It is an object of the present disclosure to provide a reflector structure composed of semiconductor material in a multijunction solar cell to increase the efficiency of the subcell located above the reflector structure.

It is another object of the present disclosure to provide a structure which has a graded index of refraction within a multijunction solar cell.

It is another object of the present disclosure to provide a multijunction solar cell in which a portion of the light passing through a solar subcell is reflected back into the subcell by the layers directly below the solar subcell in which side lobe reflectivity of the reflective layer is eliminated or reduced.

It is another object of the present disclosure to improve upon the transmissivity and reflective characteristics associated with distributed Bragg reflector (DBR) layers used in solar cells so as to improve the efficiency of a solar cell which traditionally may have incorporated such layers.

It is another object of the present disclosure to provide design features in multijunction solar cells for increasing the efficiency of the multijunction solar cell in converting solar energy (or photons) to electrical energy for space radiation environments, especially at the end-of-life (EOL) phase.

It is another object of the present disclosure to provide a reflector structure composed of semiconductor material in a multijunction solar cell to increase the efficiency of the solar cell in a high temperature and high radiation exposure environment such as found in certain space missions.

It is another object of the present disclosure to provide a structure which has a graded index of refraction within a semiconductor device.

It is another object of the present disclosure to provide a semiconductor device in which a portion of the light passing through a layer is reflected back into the layer by the layers directly below the layer in which side lobe reflectivity of the reflective layer is eliminated or reduced.

It is another object of the present disclosure to improve upon the transmissivity and reflective characteristics associated with distributed Bragg reflector (DBR) layers used in the semiconductor device so as to improve the efficiency of the device which traditionally may have incorporated such layers.

Some implementations of the present disclosure may incorporate or implement fewer of the aspects and features noted in the foregoing objects.

Features of the Disclosure

All ranges of numerical parameters set forth in this disclosure are to be understood to encompass any and all subranges or "intermediate generalizations" subsumed herein. For example, a stated range of "1.0 to 2.0 eV" for a band gap value should be considered to include any and all subranges beginning with a minimum value of 1.0 eV or more and ending with a maximum value of 2.0 eV or less, e.g., 1.0 to 1.6, or 1.3 to 1.4, or 1.5 to 1.9 eV.

As used in this disclosure, the term "graded index" refers to an index of refraction in a semiconductor layer of the solar cell which is graded or changes over the thickness of the layer. Since the index of refraction depends on the specific composition of elements in the semiconductor material in the layer, a "graded index" layer means that the composition of the semiconductor material also is graded or changes over the thickness of the layer. As used in this disclosure, the "gradation" of the index may be continuous or discrete (i.e. in incremental steps) over the thickness of the layer. In some embodiments, the gradation or incremental change may be at a constant rate of change over the thickness of the layer, or discontinuous, i.e. at different rates of change depending upon the vertical position in the thickness of the layer.

In one aspect, the technical problem to be solved in the present disclosure is improving EOL performance in a multijunction solar cell, and in particular in a solar cell which incorporates a semiconductor reflector structure, such as a distributed Bragg reflector (DBR), below one of the subcells to reflect light in a given spectral range back into the subcell above it. In particular, the present disclosure addresses a reduction in efficiency that can be associated with the spectral side lobe reflection characteristics (i.e., the measured reflectance as a function of wavelength) of a traditional DBR structure. The present disclosure proposes a reflection structure incorporating a sequence of layers having defined different indices of refraction in the layer structure that differs from the layered structure of a DBR, or traditional DBR structures, and substantially reduces such side lobes from the spectral reflection curves of the reflection structure.

Briefly, and in general terms, the present disclosure provides a multijunction solar cell comprising: an upper solar subcell having an emitter layer and a base layer forming a photoelectric junction, the base layer having a bottom surface; a graded-index reflector structure disposed beneath the base layer of the upper solar subcell and having a greater band gap than the upper solar subcell; and a lower solar subcell disposed beneath the first graded-index structure.

In another aspect, the present disclosure provides a multijunction solar cell comprising: an upper solar subcell having an emitter layer and a base layer forming a photoelectric junction, the base layer having a bottom surface; a graded-index structure disposed beneath the base layer of the upper solar subcell; wherein the first graded-index reflector structure comprises a first plurality of pairs of alternating layers of two different semiconductor materials, wherein and a mole fraction of one constituent element is increased for each of the layers in the plurality of pairs of alternating layers as the distance between the surface of the alternating layers and the bottom surface of the upper solar subcell increases so as to form an incremental increase on the index of refraction between the alternating layers and a lower solar subcell disposed beneath the first graded-index structure.

In another aspect, the present disclosure provides a multijunction solar cell comprising: an upper solar subcell having an emitter layer and a base layer forming a photoelectric junction; a first graded-index reflector structure disposed beneath the base layer of the upper solar subcell; wherein the first graded-index reflector structure comprises a plurality of pairs of alternating layers of $Al_xGa_{(1-x)}As/Al_yGa_{(1-y)}As$, wherein $0<x<1$, $0<y<1$, wherein a mole fraction of aluminum of the $Al_xGa_{(1-x)}As$ layer is increased for each of the pairs; and a lower solar subcell disposed beneath the first graded-index reflector structure; wherein the lower solar subcell has an emitter layer and a base layer forming a photoelectric junction; wherein the first graded-index reflector structure is constructed such that (i) at least a portion of light of a first spectral wavelength range that enters and passes through the upper solar subcell is reflected back into the upper solar subcell by the first graded-index reflector structure; (ii) at least a portion of light of a second spectral wavelength range that enters and passes through the upper solar subcell is transmitted through the first graded-index reflector structure to layers disposed beneath the first graded-index reflector structure, wherein the second spectral wavelength range is composed of greater wavelengths than the wavelengths of the first spectral wavelength range.

In another aspect, the present disclosure provides a multijunction solar cell comprising: an upper solar subcell having an emitter layer and a base layer forming a photoelectric junction, the base layer having a bottom surface; a first graded-index reflector structure disposed beneath the base layer of the upper solar subcell; wherein the first graded-index reflector structure comprises a first plurality of pairs of alternating layers of $In_yAl_xGa_{(1-x-y)}As$ and a different semiconductor material, wherein $0<x<1$, and $0<y\leq0.3$ and a mole fraction of aluminum is increased for each of the $In_yAl_xGa_{(1-x-y)}As$ layers in the first plurality of pairs of alternating layers as the distance between the surface of the alternating layers and the bottom surface of the upper solar subcell increases; and a lower solar subcell disposed beneath the first graded-index structure; wherein the lower solar subcell has an emitter layer and a base layer forming a photoelectric junction.

In some embodiments, there further comprises a second graded-index structure disposed beneath the base layer of the lower solar subcell.

In another aspect, the present disclosure provides a four junction solar cell comprising: an upper first solar subcell composed of a semiconductor material having a first band gap; an upper solar subcell having an emitter layer and a base layer forming a photoelectric junction, the base layer having a bottom surface; a first graded-index reflector structure disposed beneath the base layer of the upper solar subcell; wherein the first graded-index reflector structure comprises a first plurality of pairs of alternating layers of $In_yAl_xGa_{(1-x-y)}As$ and a different semiconductor material, wherein $0<x<1$, and $0<y\leq0.3$ and a mole fraction of aluminum is increased for each of the $In_yAl_xGa_{(1-x-y)}As$ layers in the first plurality of pairs of alternating layers as the distance between the surface of the alternating layers and the bottom surface of the upper solar subcell increases; and a second solar subcell adjacent to said graded-index reflector structure and composed of a semiconductor material having a second band gap smaller than the first band gap and being lattice matched with the upper first solar subcell; a third solar subcell adjacent to said second solar subcell and composed of a semiconductor material having a third band gap smaller than the second band gap and being lattice matched with the second solar subcell; a graded interlayer adjacent to said third solar subcell, said graded interlayer having a fourth band gap greater than the third band gap; and a bottom solar subcell adjacent to the graded interlayer and being lattice mismatched with the third solar subcell and composed of a semiconductor material having a fifth band gap smaller than the fourth band gap; wherein the graded interlayer is compositionally graded to lattice match the third solar subcell on one side and the bottom solar subcell on the other side, and is epitaxially grown over the bottom solar subcell and is composed of any of the As, P, N, Sb based III-V compound semiconductors subject to the constraints of having the in-plane lattice parameter less than or equal to that of the third solar subcell and greater than or equal to that of the growth substrate.

In some embodiments, the specific materials of the first graded-index structure form a reflector structure and the materials are selected and constructed such that (i) at least a portion of light of a first spectral wavelength range that enters and passes through the upper solar subcell is reflected back into the upper solar subcell by the first graded-index reflector structure; (ii) at least a portion of light of a second spectral wavelength range that enters and passes through the upper solar subcell is transmitted through the first graded-index reflector structure to layers disposed beneath the first graded-index reflector structure, wherein the second spectral wavelength range is composed of greater wavelengths than the wavelengths of the first spectral wavelength range so that photons of the first spectral wavelength range which have not been absorbed by the upper solar subcell are reflected back into the upper solar subcell for possible absorption therein, thereby increasing the efficiency of the upper solar subcell.

In some embodiments, the lower solar subcell is the semiconductor growth substrate and is composed of germanium.

In some embodiments, there further comprises a buffer layer disposed between the germanium growth substrate and the first graded-index structure.

In some embodiments, the increase in mole fraction of aluminum in the $In_yAl_xGa_{(1-x-y)}As$ layer in the first plurality of pairs of alternating layers ranges from 20% to 90%, i.e., the value of x ranges from 0.2 to 0.9, wherein the first graded-index reflector structure further comprises: a second plurality of pairs of alternating layers of $In_yAl_xGa_{(1-x-y)}As$ and the different semiconductor material wherein a mole fraction of aluminum for each of the $In_yAl_xGa_{(1-x-y)}As$ layers is decreased in the second plurality of pairs of alternating layers as the distance between the alternating layers in the second plurality of alternating layers and the upper solar subcell increases; and wherein the different semiconductor material is $InAl_xGa_{1-x}As$, where $0<x<0.16$.

In some embodiments, the solar cell is a four junction solar cell and the average band gap of all four subcells (i.e., the average or numerical sum of the individual band gaps of each of the four subcells, divided by four) is equal to or greater than 1.35 eV.

In some embodiments, the upper solar subcell is composed of indium gallium aluminum phosphide.

In some embodiments, the lower solar subcell includes an emitter layer composed of indium gallium phosphide or aluminum indium gallium arsenide, and a base layer composed of aluminum indium gallium arsenide, wherein the emitter and base layers of the lower solar subcell form a photoelectric junction, and the lower solar subcell has a band gap in the range of 1.55 to 1.8 eV.

In some embodiments, there further comprises a third solar subcell below the lower solar subcell, the third solar subcell being composed of indium gallium arsenide and has a third band gap less than that of the lower solar subcell and is lattice matched with the lower solar subcell.

In some embodiments, the growth substrate is composed of germanium and has a band gap of approximately 0.67 eV.

In some embodiments, the upper solar subcell has a band gap of less than 2.15, the second solar subcell has a band gap of less than 1.73 eV; and the third solar subcell has a band gap in the range of 1.15 to 1.2 eV.

In some embodiments, the first solar subcell has a band gap of 2.05 eV.

In some embodiments, the band gap of the third solar subcell is less than 1.41 eV, and is greater than that of the fourth subcell.

In some embodiments, the upper subcell is composed of a base layer of $(In_xGa_{1-x})_{1-y}Al_yP$ where x is 0.505, and y is 0.142, corresponding to a band gap of 2.10 eV, and an emitter layer of $(In_xGa_{1-x})_{1-y}Al_yP$ where x is 0.505, and y is 0.107, corresponding to a band gap of 2.05 eV.

In some embodiments, there further comprises a grading layer between the lower subcell and the third subcell, wherein the grading interlayer is compositionally step-graded with between one and four steps and is composed of $In_xGa_{1-x}As$ or $(In_xGa_{1-x})_yAl_{1-y}As$ with $0<x<1$, $0<y<1$, and x and y selected such that the band gap is in the range of 1.15 to 1.41 eV throughout its thickness.

In some embodiments, the grading interlayer has a graded band gap in the range of 1.15 to 1.41 eV, or 1.2 to 1.35 eV, or 1.25 to 1.30 eV.

In some embodiments, either (i) the emitter layer; or (ii) the base layer and emitter layer, of the upper subcell have different lattice constants from the lattice constant of the lower subcell.

In another aspect, the present disclosure provides a multijunction solar cell comprising: an upper solar subcell having an emitter layer and a base layer forming a photoelectric junction; a first graded-index structure disposed beneath the base layer of the upper solar subcell, wherein the first graded-index reflector structure comprises: a first plurality of pairs of alternating layers of $In_yAl_xGa_{(1-x-y)}As$ and a different semiconductor material, wherein $0<x<1$, $0\leq y\leq 0.3$, and a mole fraction of aluminum is increased for each of the $In_yAl_xGa_{(1-x-y)}As$ layers in the first plurality of pairs of alternating layers as the distance between the alternating layers and the upper solar subcell increases, a second plurality of pairs of alternating layers of $In_yAl_xGa_{(1-x-y)}As$ and a different semiconductor material, wherein $0<x<1$, $0\leq y\leq 0.3$, and a mole fraction of aluminum repeats for each of the $In_yAl_xGa_{(1-x-y)}As$ layers in the second plurality of pairs of alternating layers as the distance between the alternating layers and the upper solar subcell increases; and a third plurality of pairs of alternating layers of $In_yAl_xGa_{(1-x-y)}As$ and a different semiconductor material, wherein $0<x<1$, $0\leq y\leq 0.3$, and a mole fraction of aluminum is decreased for each of the $In_yAl_xGa_{(1-x-y)}As$ layers in the third plurality of pairs of alternating layers as the distance between the alternating layers and the upper solar subcell increases; a lower solar subcell disposed beneath the first graded-index reflector structure, wherein the lower solar subcell has an emitter layer and a base layer forming a photoelectric junction.

In some embodiments, the above disclosed multijunction solar cells optionally further comprise one or more additional graded index layer structures disposed beneath one or more additional subcells.

For example, in some embodiments, the above disclosed multijunction solar cells optionally further comprise a second graded-index reflector structure disposed beneath the base layer of the lower solar subcell; wherein the second graded-index reflector structure is constructed such that (i) at least a portion of light of a first spectral wavelength range that enters and passes through the lower solar subcell is reflected back into the lower solar subcell by the second graded-index reflector structure; and (ii) at least a portion of light of a second spectral wavelength range that enters and passes through the lower solar subcell is transmitted through the second graded-index reflector structure to layers disposed beneath the second graded-index reflector structure, wherein the second spectral wavelength range is composed of greater wavelengths than the wavelengths of the first spectral wavelength range.

In some embodiments, the above-disclosed multijunction solar cells are upright multijunction solar cells.

In some embodiments, the above-disclosed multijunction solar cells are upright metamorphic multijunction solar cells.

In some embodiments, the above-disclosed multijunction solar cells are inverted metamorphic multijunction solar cells.

In some embodiments, the above-disclosed multijunction solar cells are III-V compound semiconductor multijunction solar cells.

In another aspect, the present disclosure provides a method of fabricating a multijunction solar cell including an upper solar subcell having an emitter layer and a base layer forming a photoelectric junction, the base layer having a bottom surface and a lower solar subcell; wherein the lower solar subcell has an emitter layer and a base layer forming a photoelectric junction comprising forming a reflector structure using a successive layers with a changing or graded index of refraction disposed beneath the base layer of the upper solar subcell.

In another aspect, the present disclosure provides a method of forming a multijunction solar cell comprising providing an upper solar subcell having an emitter layer and a base layer forming a photoelectric junction, the base layer having a bottom surface; growing a graded-index reflector structure disposed beneath the base layer of the upper solar subcell; wherein the graded-index reflector structure comprises a first plurality of pairs of alternating layers of two different semiconductor materials, in which the mole fraction of aluminum is increased for each of the layers in the first plurality of pairs of alternating layers as the distance between the surface of the alternating layers and the bottom surface of the upper solar subcell increases; and a lower solar subcell disposed beneath the first graded-index structure; wherein the lower solar subcell has an emitter layer and a base layer forming a photoelectric junction.

In some embodiments, additional layer(s) may be added or deleted in the cell structure without departing from the scope of the present disclosure.

Some implementations of the present disclosure may incorporate or implement fewer of the aspects and features noted in the foregoing summaries.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

In certain embodiments, the multijunction solar cells having one or more graded-index reflector structure according to the present disclosure can provide advantages over multijunction solar cells having one or more Distributed Bragg Reflector (DBR) layers. For example, by reducing or eliminating side lobe reflectivity encountered with DRB layers. The reduction or elimination of side lobe reflectivity with the graded-index reflector structure can allow for the practical and efficient design of multijunction solar cells having such a reflector structure disposed below one subcell, two subcells, three subcells, or even all subcells of the multijunction solar cell.

BRIEF DESCRIPTION OF THE DRAWING

The invention will be better and more fully appreciated by reference to the following detailed description when considered in conjunction with the accompanying drawings, wherein.

DESCRIPTION OF THE PREFERRED EMBODIMENT

Figure 1:
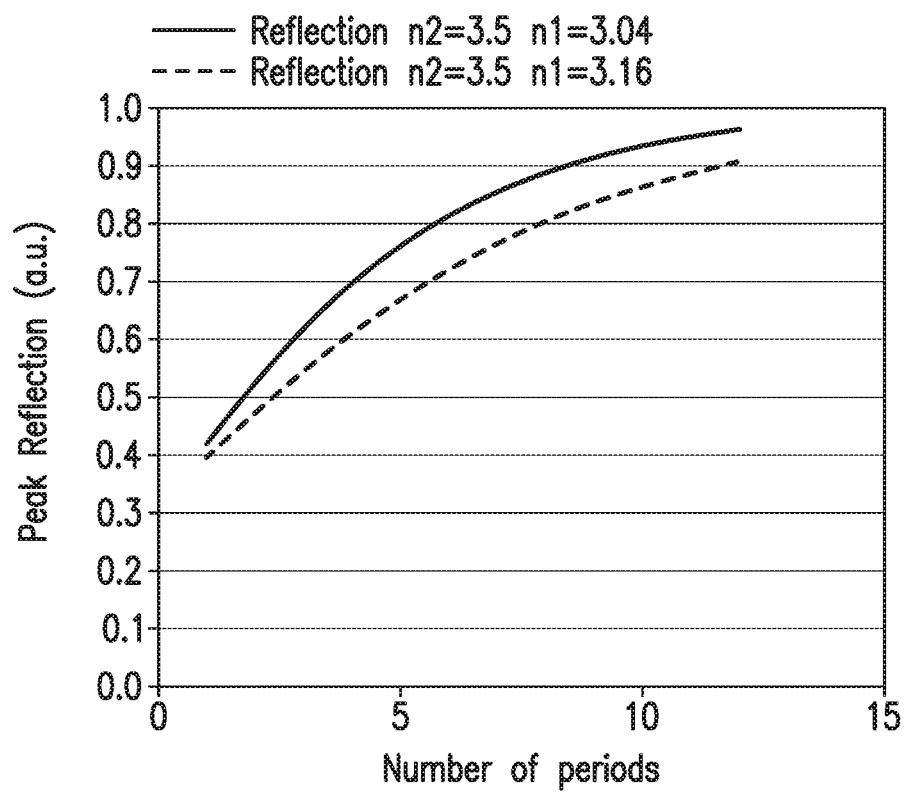
FIG. 1 is a graphical illustration of peak reflection vs. number of periods for exemplary DBRs with alternating layers having (i) a larger index of refraction difference (solid line), and (ii) a smaller index of refraction difference (dashed line).

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

A variety of different features of multijunction solar cells (as well as inverted metamorphic multijunction solar cells) are disclosed in the related applications noted above. Some, many or all of such features may be included in the structures and processes associated with the "upright" solar cells of the present disclosure. However, more particularly, the present disclosure is directed to the fabrication of a multi-junction solar cell grown on a single growth substrate. More specifically, in some embodiments, the present disclosure relates to four junction solar cells with direct band gaps in the range of 2.0 to 2.15 eV (or higher) for the top subcell, and (i) 1.65 to 1.8 eV, and (ii) 1.41 eV or less, for the middle subcells, and (iii) 0.6 to 0.8 eV indirect bandgaps for the bottom subcell, respectively.

The present disclosure provides an unconventional four junction or multijunction design that leads to a surprising significant performance improvement over that of traditional three or four junction solar cells, even those that incorporate a DBR layer under the second subcell. This performance gain is especially realized at high temperature and after high exposure to space radiation by the proposal of incorporating a superior semiconductor reflective structure under one or more of the subcells, thus specifically addressing the problem of ensuring continues adequate efficiency and power output at the "end-of-life".

The use of a Distributed Bragg Reflector (or DBR) is known for use in solar cells. A DBR is a specially formulated sequence of thin film semiconductor layers that offers a high degree of reflectance over a specific wavelength range. The central wavelength in free space (air), $\lambda_{central}$, of the reflectivity band can be adjusted by employing two or more materials that have a difference in their optical index of refraction. The reflector may be realized by placing repeating alternating pairs of each material. The thickness of each layer is ¼ of the central wavelength inside the material, or $t=\lambda_{central}/\{4n(\lambda_{central})\}$, where t is the layer thickness and $n(\lambda_{central})$, is the index of refraction of the layer at the central wavelength.

DBR reflectivity is calculated from Maxwell's equations via the transfer matrix method. It can also be approximated by the following equation:

$$R = \left[\frac{n_o(n_2)^{2N} - n_s(n_1)^{2N}}{n_o(n_2)^{2N} + n_s(n_1)^{2N}}\right]^2,$$

where $n_{0,1,2,s}$ are the refractive indices of the originating material, the two alternating materials, and the substrate material; and N is the number of repeated pairs. The frequency bandwidth, $\Delta f_o$, of the reflection band can be approximated by:

$$\frac{\Delta f_0}{f_0} = \frac{4}{\pi}\arcsin\left(\frac{n_2 - n_1}{n_2 + n_1}\right),$$

where $f_o$ is the central frequency of the band. Adding and subtracting $\Delta f_o$ from $f_o$ and converting the two frequencies into wavelength via $c=f\lambda$, one arrives at approximate bandwidth of reflector in free space.

Figure 2:
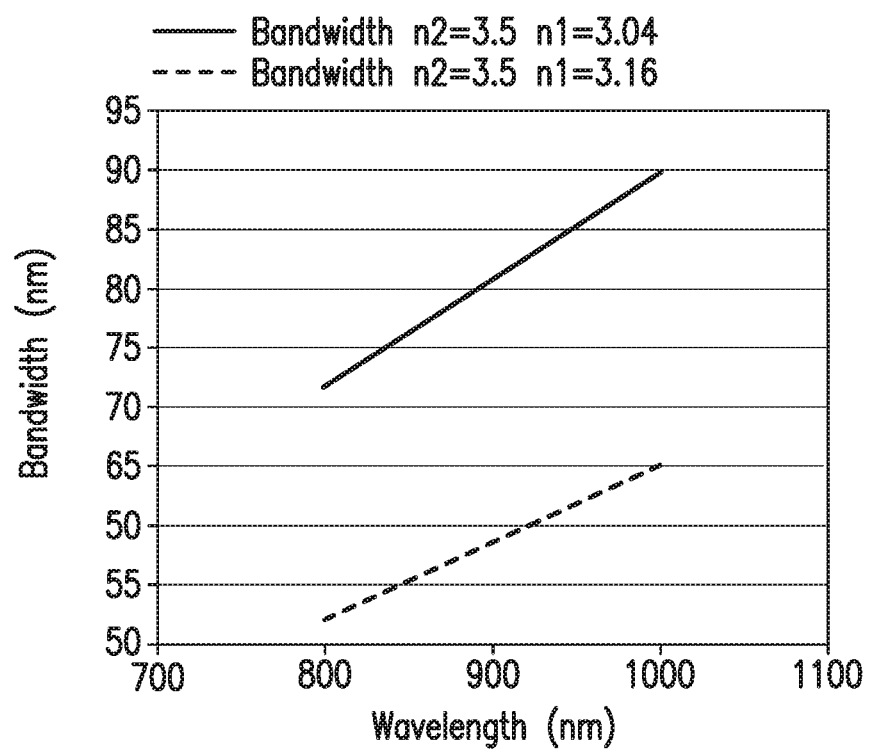
FIG. 2 is a graphical illustration of approximate bandwidth of the reflector for exemplary DBRs with alternating layers having (i) a larger index of refraction difference (solid line), and (ii) a smaller index of refraction difference (dashed line).

FIG. 1 is a graphical illustration of peak reflection vs. number of periods for exemplary DBRs with alternating layers having (i) a larger index of refraction difference (solid line), and (ii) a smaller index of refraction difference (dashed line). FIG. 2 is a graphical illustration of approximate bandwidth of the reflector for exemplary DBRs with alternating layers having (i) a larger index of refraction difference (solid line), and (ii) a smaller index of refraction difference (dashed line).

Increasing the number of pairs in a DBR increases the mirror reflectivity as illustrated in FIG. 1, while increasing the refractive index contrast between the materials in the Bragg pairs increases both the reflectivity (at a given number of periods) and the bandwidth as illustrated in FIG. 1 and FIG. 2. Stated otherwise, a higher index of refraction change may require fewer alternating pairs to reach a high reflectivity and may produce a broader bandwidth, which may be precisely what is desired for economical incorporation into a multijunction solar cell. For fiber optics, the desired bandwidth is extremely narrow so a very small index of refraction change may be preferable, and thus, hundreds of alternating pairs may be used to reach a high degree of reflectivity.

Figure 3:
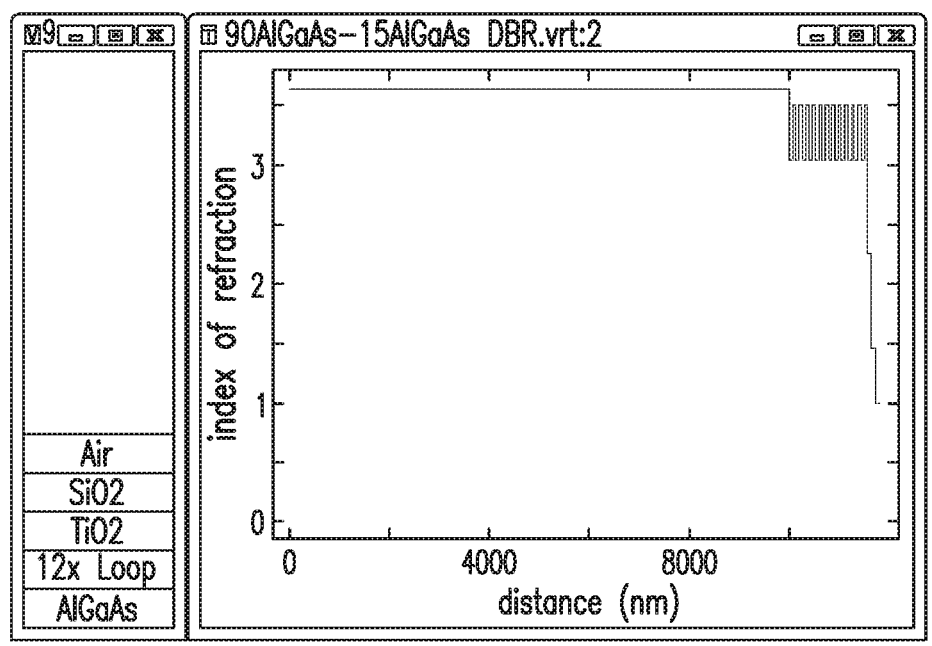
FIG. 3 illustrates the structure of a simulated DBR on the left, and the index of refraction change as a function of depth from the rear of the device. The oscillating layers near the front of the device represent the DBR pairs.

When the transfer matrix method is used to calculate the DBR reflectance as a function of wavelength, a more accurate result may be obtained when dispersive material properties are used (i.e., index of refraction and absorption coefficient as a function of wavelength). Simulated results from the computer program VERTICAL (developed at Sandia National Laboratories for VCSELS, 1996) are illustrated in FIG. 3. FIG. 3 illustrates the structure of a simulated DBR on the left, and the index of refraction change as a function of depth from the rear of the device. The oscillating layers near the front of the device represent the DBR pairs.

The central wavelength of the DBR is designed to be 800 nm in the example. The substrate is GaAs (mole fraction of aluminum=0) and the DBR has 12 periods of $Al_{0.9}Ga_{0.1}As/Al_{0.15}Ga_{0.85}As$. In some embodiments, the $Al_{0.9}Ga_{0.1}As$ is deposited on the substrate first with an index of refraction n=3.04 and thickness t=67.1 nm. The $Al_{0.15}Ga_{0.85}As$ follows, which may have an index of refraction n=3.51 and thickness t=57.8 nm. The pair may be repeated 12 times and be coated with a standard dual layer antireflection coating consisting of $TiO_2$ t=60 nm and $SiO_2$ t=100 nm.

Figure 4:
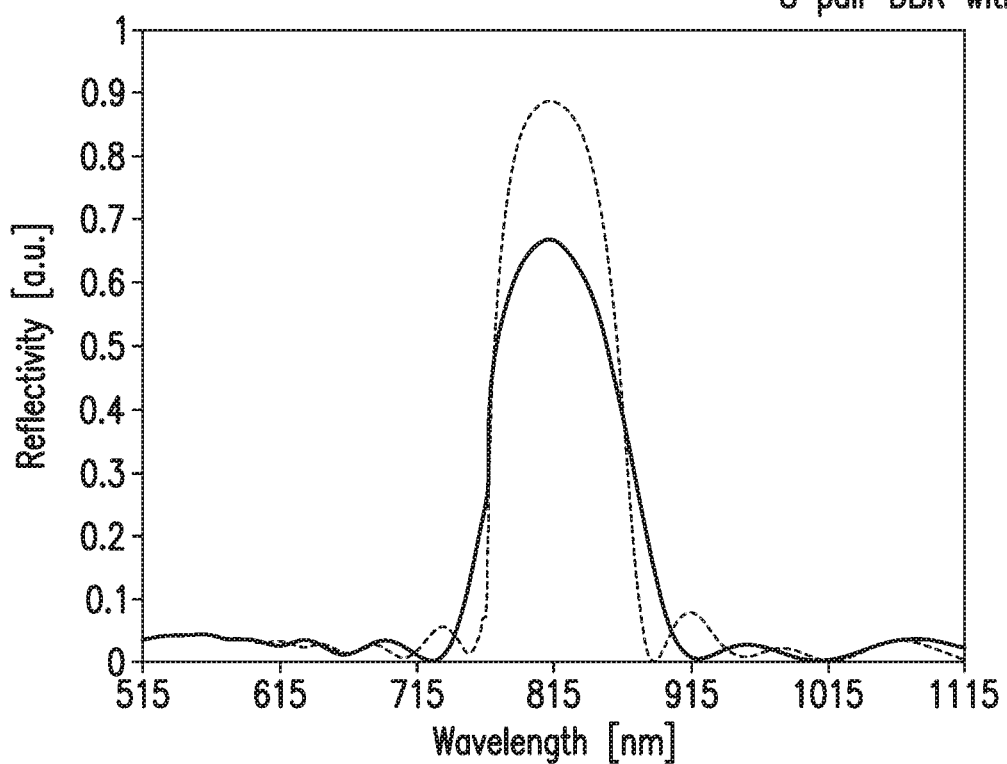
FIG. 4 is a plot illustrating simulated reflectance for DBRs with 12 pairs of alternating layers (dashed line) and 8 pairs of alternating layers (solid line) of $Al_{0.9}Ga_{0.1}As/Al_{0.15}Ga_{0.85}As$, centered at 815 nm.

The resulting reflectivity of the structure above is shown in FIG. 4 for both 12 pairs and 8 pairs of alternating layers. FIG. 4 is a plot illustrating simulated reflectance for DBRs with 12 pairs of alternating layers (dashed line) and 8 pairs of alternating layers (solid line) of $Al_{0.9}Ga_{0.1}As/Al_{0.15}Ga_{0.85}As$, centered at 815 nm. One can see that by increasing the number of pairs, the peak reflectance increases. In addition, the full width half maximum of the reflection band is approximately 100 nm, broadening slightly for the 8-pair device.

Figure 5:
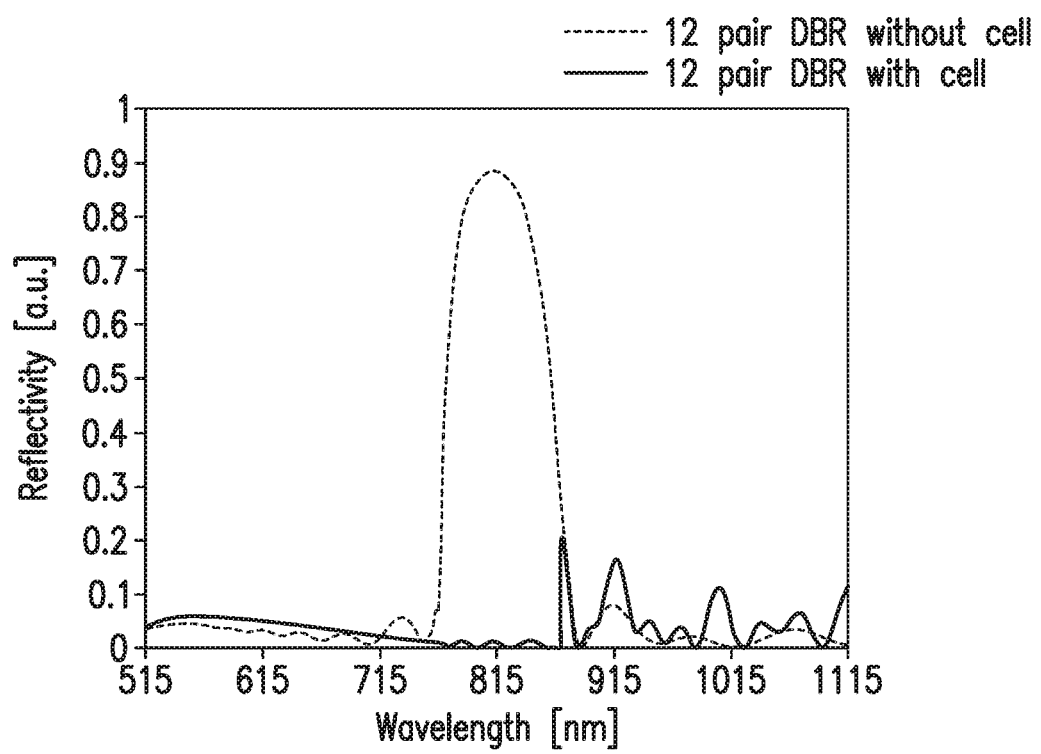
FIG. 5 is a plot illustrating the simulated reflectance for a DBR with 12 pairs of alternating layers of $Al_{0.9}Ga_{0.1}As/Al_{0.15}Ga_{0.85}As$ both without (dashed line) and with (solid line) an overlying 2500 nm thick layer of GaAs that absorbs the majority of incoming light up to 870 nm.

If a thick semiconductor layer is deposited above the DBR, most of the incident light may be absorbed up to the bandgap energy of the layer. In some embodiments, any light that is not absorbed by the material will reflect off the DBR, effectively doubling the optical thickness of the semiconductor layer over the wavelength region where the DBR reflectance is near unity. FIG. 5 is a plot illustrating the simulated reflectance for a DBR with 12 pairs of alternating layers of $Al_{0.9}Ga_{0.1}As/Al_{0.15}Ga_{0.85}As$ both without (dashed line) and with (solid line) an overlying 2500 nm thick layer of GaAs that absorbs the majority of incoming light up to 870 nm. The plot shows that only the remnants of the DBR side lobes are visible above 870 nm.

The numerous reflectance peaks above 870 nm result in a lower transmission of light into the material below the DBR stack. In the case of a triple junction solar cell, where the DBR is deposited beneath the $2^{nd}$ (In)GaAs subcell, the $3^{rd}$ Ge subcell may not be greatly affected by the resulting light loss since it has an approximately 40% excess in photocurrent. Nevertheless, reducing the side lobe reflection peaks may increase the photocurrent of the Ge subcell and improve the triple junction FF and device performance slightly.

In designs that require a high degree of current matching in all subcells, the resulting side lobe reflection losses may be so problematic that any performance gain made at EOL by the employment of a DBR may be lost by the reduced current in the subcell below. Thus, it is clear that there is a need for an internal reflector that offers the performance of a traditional DBR but does not result in excessive side lobe losses.

Disclosed herein are multijunction solar cells that include a graded-index reflector structure. Compared to a DBR, it has been found that graded-index reflector structures can reduce or eliminate side lobe reflectivity. Thus, graded-index reflector structures are sometimes referred to as apodized reflectors.

Apodized or graded-index reflector structures are sometimes used in the fiber optics industry. In the reflector design of the present disclosure, instead of having repeating pairs of high and low index materials, the index of refraction difference is gradually increased as the number of periods increase. Then, one or more periods of the maximum index difference pairs are layered, followed by a gradual decrease in the index of refraction difference.

Figure 6:
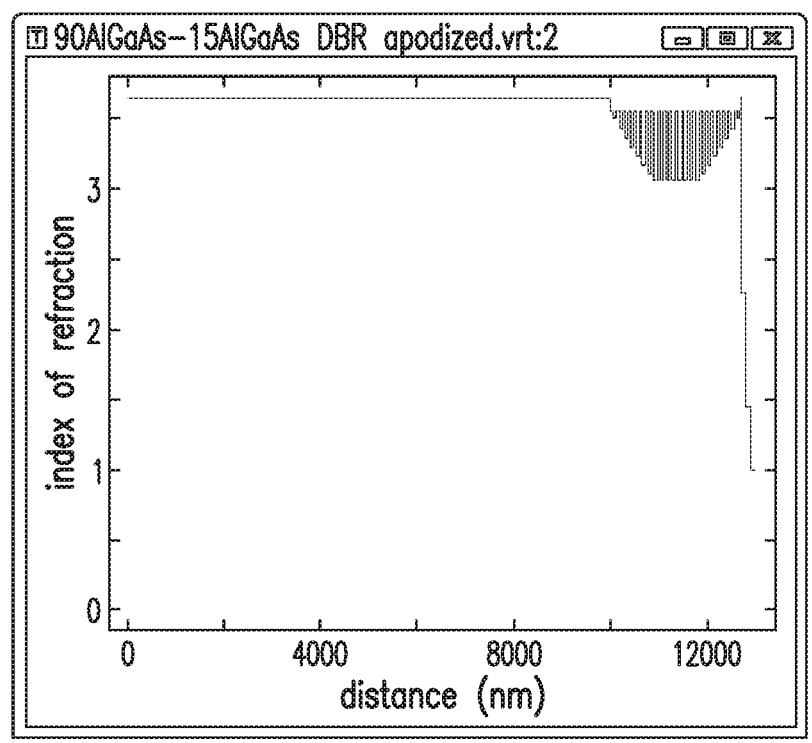
FIG. 6 is an index of refraction profile for a graded-index reflector structure with 20 pairs of alternating layers of $Al_xGa_{(1-x)}As/Al_{.15}Ga_{85}As$, wherein $0<x<1$, and x is gradually increased and decreased on each side of the center 6 pairs of $Al_{0.9}Ga_{0.1}As/Al_{0.15}Ga_{0.85}As$.

FIG. 6 is in one embodiment an index of refraction profile for a graded-index reflector structure with 20 pairs of alternating layers of $Al_xGa_{(1-x)}As/Al_{15}Ga_{85}As$, wherein $0<x<1$, and x is gradually increased and decreased on each side of the center 6 pairs of $Al_{0.9}Ga_{0.1}As/Al_{0.15}Ga_{0.85}As$.

Figure 7:
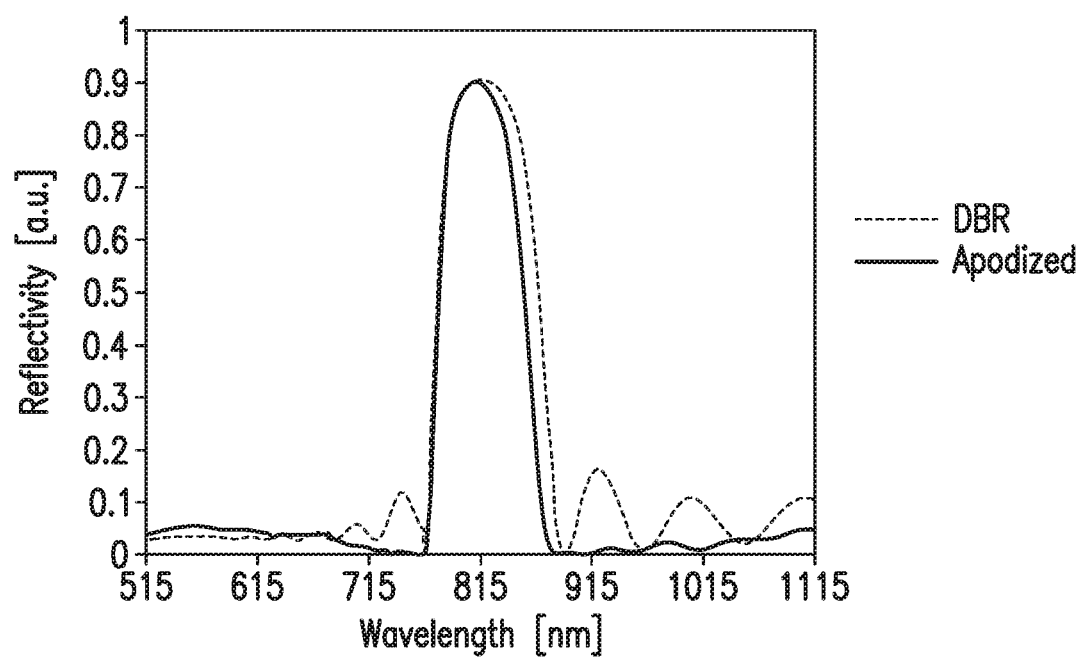
FIG. 7 is a plot of the simulated reflectance for a DBR with 12 pairs of alternating layers of $Al_{0.9}Ga_{0.1}As/Al_{0.15}Ga_{0.85}As$ (solid line) compared with a graded-index reflector structure with 20 pairs of alternating layers of $Al_xGa_{(1-x)}As/Al_{0.15}Ga_{0.85}As$, wherein $0<x<1$, and x is gradually increased and decreased by 10% for each pair on both sides of the center 6 pairs of alternating layers of $Al_{0.9}Ga_{0.1}As/Al_{0.15}Ga_{0.85}As$ (dashed line).

In FIG. 7, to demonstrate the improvement over a DBR structure, a 20-pair graded-index reflector structure is compared to a 12-pair traditional DBR. FIG. 7 is a plot of the simulated reflectance for a DBR with 12 pairs of alternating layers of $Al_{0.9}Ga_{0.1}As/Al_{0.15}Ga_{0.85}As$ (solid line) compared with a graded-index reflector structure with 20 pairs of alternating layers of $Al_xGa_{(1-x)}As/Al_{0.15}Ga_{0.85}As$, in one embodiment, wherein $0<x<1$, and x is gradually increased and decreased by 10% for each pair on both sides of the center 6 pairs of alternating layers of $Al_{0.9}Ga_{0.1}As/Al_{0.15}Ga_{0.85}As$ (dashed line). The mole fraction of aluminum of the lower index $Al_{0.2}Ga_{0.8}As$ is increased by 10% for each pair from $Al_{0.2}Ga_{0.8}As/Al_{0.15}Ga_{0.85}As$ to $Al_{0.9}Ga_{0.1}As/Al_{0.15}Ga_{0.85}As$. Then, 5 pairs of $Al_{0.9}Ga_{0.1}As/Al_{0.15}Ga_{0.85}As$ are repeated to increase the maximum reflectivity value. Finally, the mole fraction of aluminum is decreased by 10% for each pair as before to result in the graded-index profile. In some embodiments, the result is a reflectivity profile that has the same peak as the 12-period DBR, a slightly narrower bandwidth, and most importantly, no side lobes in the infrared above 870 nm.

Figure 8:
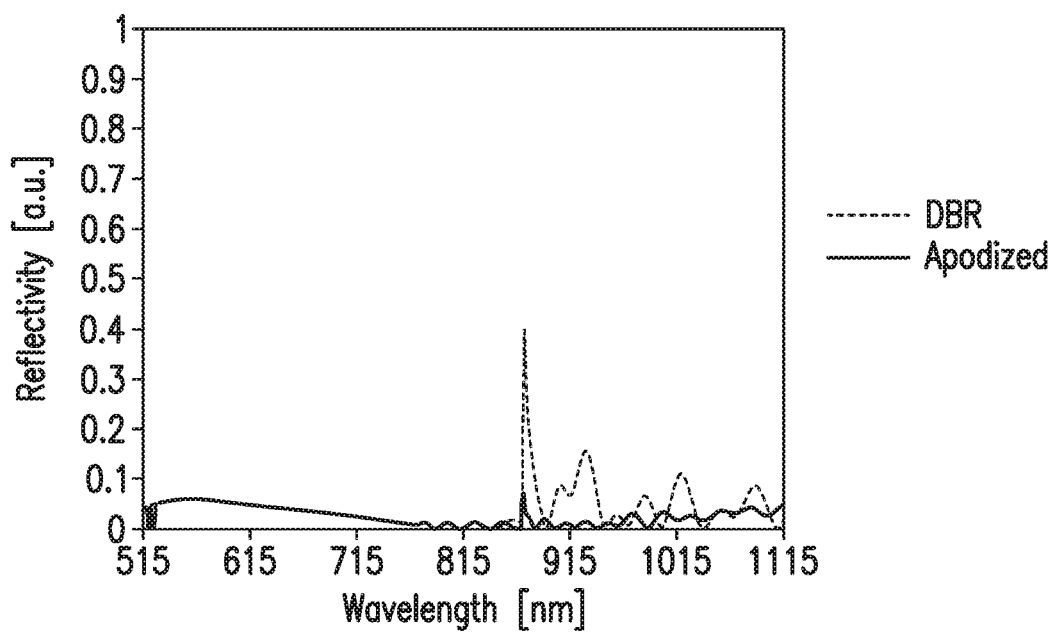
FIG. 8 is a plot of the simulated reflectance for the DBR (dashed line) and the graded-index reflector structures (solid line) of FIG. 7 after an absorbing 2500 nm thick GaAs cell is deposited above the reflective layers. Note the large reduction in side lobe reflection losses.

If a thick semiconductor layer is deposited above the reflector structure, most of the incident light may be absorbed up to the bandgap energy of the layer. In some embodiments, any light that is not absorbed by the material will reflect off the reflector structure, effectively doubling the optical thickness of the semiconductor layer over the wavelength region where the graded-index reflectance is near unity. FIG. 8 is a plot of the simulated reflectance for the DBR (dashed line) and the graded-index reflector structures (solid line) of FIG. 7 after an absorbing 2500 nm thick GaAs solar subcell is deposited above the reflective layers. Note the large reduction in side lobe reflection losses. Note the large reduction in side lobe reflection losses. The plot shows that only the remnants of the DBR side lobes are visible above 870 nm.

The lack of side lobes opens up the opportunity to use internal reflectors under multiple subcells, or even every subcell, in a multijunction solar cell.

Figure 9:
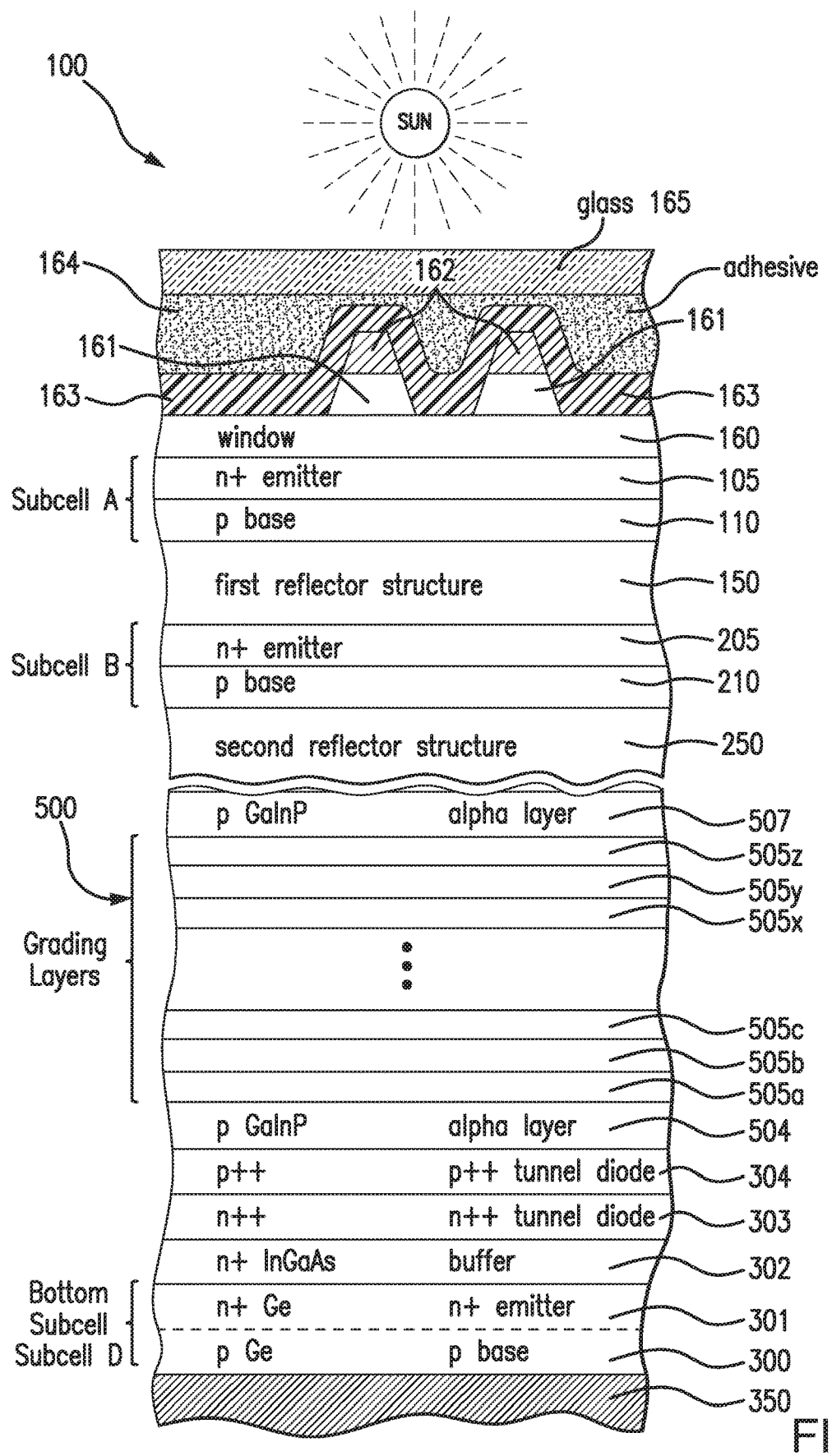
FIG. 9 is a schematic representation of an exemplary multijunction solar cell having a graded-index reflector structure according to the present disclosure.

Turning to the multijunction solar cell device of the present disclosure, FIG. 9 is a cross-sectional view of a first embodiment of a multijunction solar cell 100 after several stages of fabrication including the growth of certain semiconductor layers on the growth substrate up to the contact layer 322, such as presented in to the disclosure of U.S. patent application Ser. No. 15/873,135 filed Jan. 17, 2018, or Ser. No. 16/504,828 filed Jul. 8, 2019. For simplicity, only the top two subcells A and B are illustrated in the Figure, but one, two or more additional subcells may be included in the solar cell 100 in other embodiments within the scope of the present disclosure.

As shown in the illustrated example of FIG. 9, the bottom subcell D includes a growth substrate 300 formed of p-type germanium ("Ge") which also serves as a base layer. A back metal contact pad 350 formed on the bottom of base layer 300 provides the bottom p type polarity electrical contact to the multijunction solar cell 100. The bottom subcell D, further includes, for example, a highly doped n-type Ge emitter layer 301, and an n-type indium gallium arsenide ("InGaAs") nucleation layer 302. The nucleation layer is deposited over the base layer, and the emitter layer 301 is formed in the substrate 300 by diffusion of dopants into the Ge substrate 300, thereby forming the n-type Ge layer 301. Heavily doped p-type aluminum indium gallium arsenide ("AlGaAs") and heavily doped n-type gallium arsenide ("GaAs") tunneling junction layers 304, 303 may be deposited over the nucleation layer to provide a low resistance pathway between the bottom and middle subcells.

In one embodiment, a first alpha layer 504, preferably composed of InGaP or other suitable material, is deposited over the tunnel diode 303/304, to a thickness of between 0.25 and 1.0 micron. Such an alpha layer is intended to prevent threading dislocations from propagating, either opposite to the direction of growth into the bottom subcell 301/300, or in the direction of growth into the adjacent middle subcell C and is more particularly described in U.S. Patent Application Pub. No. 2009/0078309 A1 (Cornfeld et al.).

A metamorphic layer (or graded interlayer) 500 is deposited over the alpha layer 504 (if present) using a surfactant. Layer 500 is preferably a compositionally step-graded series of InGaAlAs layers, preferably with monotonically changing lattice constant, so as to achieve a gradual transition in lattice constant in the semiconductor structure from the bottom subcell 300/301 to the middle subcell C while minimizing threading dislocations from occurring. The band gap of layer 500 is constant throughout its thickness, in the range of 1.22 to 1.34 eV or other appropriate band gap.

In the surfactant assisted growth of the metamorphic layer 500, a suitable chemical element is introduced into the reactor during the growth of layer 500 to improve the surface characteristics of the layer. In one embodiment, such element may be a dopant or donor atom such as selenium (Se) or tellurium (Te). Small amounts of Se or Te are therefore incorporated in the metamorphic layer 500, and remain in the finished solar cell. Although Se or Te are the preferred n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes threading dislocations in the active regions, and therefore improves overall solar cell efficiency.

As an alternative to the use of non-isoelectronic one may use an isoelectronic surfactant. The term "isoelectronic" refers to surfactants such as antimony (Sb) or bismuth (Bi), since such elements have the same number of valence electrons as the P atom of InGaP, or the As atom in InGaAlAs, in the metamorphic buffer layer. Such Sb or Bi surfactants will not typically be incorporated into the metamorphic layer 406.

In one embodiment of the present disclosure, the layer 500 is composed of a plurality of layers of InGaAs, with monotonically changing lattice constant, each layer having the same band gap, approximately in the range of 1.22 to 1.34 eV. In some embodiments, the constant band gap is in the range of 1.28 to 1.29 eV.

The advantage of utilizing a constant bandgap material such as InGaAs is that arsenide-based semiconductor material is much easier to process in standard commercial MOCVD reactors.

Although the described embodiment of the present disclosure utilizes a plurality of layers of InGaAs for the metamorphic layer 500 for reasons of manufacturability and radiation transparency, other embodiments of the present disclosure may utilize different material systems to achieve a change in lattice constant from the middle subcell to the bottom subcell 300/301. Other embodiments of the present disclosure may utilize continuously graded, as opposed to step graded, materials. More generally, the graded interlayer may be composed of any of the As, P, N, Sb based III-V compound semiconductors subject to the constraints of having the in-plane lattice parameter less than or equal to that of the third solar subcell C and greater than or equal to that of the bottom solar cell and less than or equal to that of the third solar cell, and having a bandgap energy greater than that of the third solar cell.

In some embodiments, a second alpha layer 507, preferably composed of n+ type InGaP with a different composition than the first alpha layer 504, is deposited over metamorphic buffer layer 406, to a thickness from 0.25 to 1.0 micron. Such an alpha layer is intended to prevent threading dislocations from propagating, either opposite to the direction of growth into the bottom subcell, or in the direction of growth into the middle subcell, and is more particularly described in U.S. Patent Application Pub. No. 2009/0078309 A1 (Cornfeld et al.). A break is shown above alpha layer 507 since other layers may be provided therein as suggested in the related applications noted above, and in the text that follows.

In some embodiments, Distributed Bragg reflector (DBR) layers (now shown) are then grown adjacent to and between the second alpha layer 507 and the adjacent middle solar subcell C as illustrated in U.S. patent application Ser. No. 15/681,144 hereby incorporated by reference. The DBR layers are arranged so that light can enter and pass through the middle solar subcell and at least a portion of which can be reflected back into the middle solar subcell by the DBR layers.

For some embodiments, distributed Bragg reflector (DBR) layers can be composed of a plurality of alternating layers of lattice matched materials with discontinuities in their respective indices of refraction. For certain embodiments, the difference in refractive indices between alternating layers is maximized in order to minimize the number of periods required to achieve a given reflectivity, and the thickness and refractive index of each period determines the stop band and its limiting wavelength.

For some embodiments, distributed Bragg reflector (DBR) layers includes a first DBR layer composed of a plurality of n type or p type $Al_xGa_{1-x}As$ layers, and a second DBR layer disposed over the first DBR layer and composed of a plurality of n type or p type $Al_yGa_{1-y}As$ layers, where $0<x<1$, $0<y<1$, and y is greater than x.

In some embodiments, the middle subcell C (not shown) is disposed above alpha layer 507 includes a highly doped p-type aluminum gallium arsenide ("AlGaAs") back surface field ("BSF") layer, a p-type InGaAs base layer, a highly doped n-type indium gallium phosphide ("InGaP2") emitter layer and a highly doped n-type indium aluminum phosphide ("AlInP2") window layer. The InGaAs base layer of the subcell C can include, for example, approximately 1.5% In. Other compositions may be used as well. The base layer is formed over the BSF layer after the BSF layer is deposited over the DBR layers.

A window layer is deposited on the emitter layer of the subcell C. The window layer in the subcell C also helps reduce the recombination loss and improves passivation of the cell surface of the underlying junctions. Before depositing the layers of the subcell B, heavily doped n-type InGaP and p-type AlGaAs (or other suitable compositions) tunneling junction layers may be deposited over the subcell C.

Before depositing the layers of the top cell A, heavily doped n-type InGaP and p-type AlGaAs tunneling junction layers may be deposited over the subcell B, which are not illustrated to simplify the drawing.

In an embodiment, the top subcell A includes a highly doped p-type indium aluminum phosphide ("InAlP") BSF layer, a p-type InGaAlP base layer 110, a highly doped n-type InGaAlP emitter layer 105 and a highly doped n-type InAlP2 window layer. The base layer 110 of the top subcell A is deposited over the BSF layer after the BSF layer is formed over the tunneling junction layers of the subcell B. The window layer 160 is deposited over the emitter layer 105 of the top subcell A after the emitter layer 105 is formed over the base layer 110.

A cap or contact layer 161 may be deposited and patterned into separate contact regions over the window layer 160 of the top subcell A. The cap or contact layer 161 serves as an electrical contact from the top subcell A to the metal grid layer 162. The doped cap or contact layer 161 can be a semiconductor layer such as, for example, a GaAs or InGaAs layer.

After the cap or contact layer 161 is deposited, the grid lines 162 are formed via evaporation and lithographically patterned and deposited over the cap or contact layer 161.

It should be understood that the multijunction solar cell 100 can include additional layers above, below, or in between the illustrated layers, and that such additional layers have not been illustrated in FIG. 9 for simplicity and clarity.

As illustrated in FIG. 9, light enters the multijunction solar cell through the top. The multijunction solar cell includes a cover glass upper solar subcell A composed of emitter layer 105 and base layer 110. In some embodiments, the depicted upper solar subcell A can represent and include a wide variety of suitable solar subcells such as silicon subcells or III-V compound semiconductor solar subcells.

A first graded-index reflector structure 150 as described in the present disclosure is disposed beneath base layer 110 of upper solar subcell A.

Lower solar subcell B is disposed beneath the first graded-index reflector structure 150. Lower solar subcell B can be composed of the same materials or different materials than upper solar subcell A. In some embodiments, lower solar subcell B can include a wide variety of suitable solar subcells such as silicon subcells or III-V compound semiconductor solar subcells.

In some embodiments, the multijunction solar cell can optionally include a second graded-index reflector structure 250 as described in the present disclosure disposed beneath base layer 210 of solar subcell B.

For example, in some implementations, a multijunction solar cell includes an upper solar subcell, a first graded-index reflector structure, and a lower solar subcell. The upper solar subcell has an emitter layer and a base layer forming a photoelectric junction, and the base layer has a bottom surface. The first graded-index reflector structure is disposed beneath the base layer of the upper solar subcell and includes a first plurality of pairs of alternating layers and a second plurality of pairs of alternating layers. The first plurality of pairs of alternating layers are of $In_yAl_xGa_{(1-x-y)}As$ and a first different semiconductor material, wherein 0<x<1, and 0<y≤0.3, and mole fraction of aluminum is increased for each of the $In_yAl_xGa_{(1-x-y)}As$ layers in the first plurality of pairs of alternating layers as the distance between the surface of the alternating layers and the bottom surface of the upper solar subcell increases. The second plurality of pairs of alternating layers are of $In_yAl_xGa_{(1-x-y)}As$, and a second different semiconductor material, 0<x<1, and 0<y≤0.3, and a mole fraction of aluminum is decreased, for each of the plurality of pairs of $In_yAl_xGa_{(1-x-y)}As$ layers in the second plurality of pairs of alternating layers, as the distance between the surface of the alternating layers and the bottom surface of the upper solar subcell increases. The lower solar subcell is disposed beneath the first graded-index reflector structure, and the lower solar subcell has an emitter layer and a base layer forming a photoelectric junction.

The multijunction solar cell can further include a second graded-index reflector structure disposed beneath the base layer of the lower solar subcell. The second graded-index reflector structure is constructed such that (i) at least a portion of light of a first spectral wavelength range that enters and passes through the lower solar subcell is reflected back into the lower solar subcell by the second graded-index reflector structure; and (ii) at least a portion of light of a second spectral wavelength range that enters and passes through the lower solar subcell is transmitted through the second graded-index reflector structure to layers disposed beneath the second graded-index reflector structure, wherein the second spectral wavelength range is composed of greater wavelengths than the wavelengths of the first spectral wavelength range.

In some implementations, the band gap energy of the first graded-index reflector structure is greater than the band gap energy of the upper solar subcell, and the first graded-index reflector structure is composed of materials that form an optical wavelength reflector structure and the materials are selected and constructed such that (i) at least a portion of light of a first spectral wavelength range that enters and passes through the upper solar subcell is reflected back into the upper solar subcell by the first graded-index reflector structure; (ii) at least a portion of light of a second spectral wavelength range that enters and passes through the upper solar subcell is transmitted through the first graded-index reflector structure to layers disposed beneath the first graded-index reflector structure. The second spectral wavelength range is composed of greater wavelengths than the wavelengths of the first spectral wavelength range so that photons of the first spectral wavelength range which have not been absorbed by the upper solar subcell are reflected back into the upper solar subcell for possible absorption therein, thereby increasing the efficiency of the upper solar subcell.

In some implementations, the lower solar subcell is composed of germanium and forms a growth substrate of the multijunction solar cell.

In some implementations, the multijunction solar cell includes a buffer layer disposed between the growth substrate and the first graded-index reflector structure.

In some implementations, the increase in mole fraction of aluminum in the $In_yAl_xGa_{(1-x-y)}As$ layer in the first plurality of pairs of alternating layers ranges from 20% to 90%. In some implementations, the second different semiconductor material is $InAl_xGa_{1-x}As$, where 0<x<0.16.

In some implementations, the solar cell is a four junction solar cell comprising four solar subcells including the upper solar subcell and the lower solar subcell, and the average band gap energy of all four subcells is equal to or greater than 1.35 eV.

In some implementations, the upper solar subcell is composed of indium gallium aluminum phosphide, and the emitter layer of the lower solar subcell is composed of indium gallium phosphide or aluminum indium gallium arsenide, and the base layer of the lower solar subcell is composed of aluminum indium gallium arsenide, wherein the lower solar subcell has a band gap energy in the range of 1.55 to 1.8 eV.

In some implementations, the multijunction solar cell includes a third solar subcell disposed below the lower solar subcell. The third solar subcell can be composed of indium gallium arsenide, can have a third band gap less than that of the lower solar subcell and can be lattice matched with the lower solar subcell.

In some implementations, the upper solar subcell has a band gap energy of less than 2.15, the lower solar subcell has a band gap energy of less than 1.73 eV, and the third solar subcell has a band gap energy in the range of 1.15 to 1.2 eV.

In some implementations, the base layer of the upper subcell is composed of $(In_xGa_{1-x})_{1-y}Al_yP$ where x is 0.505, and y is 0.142, corresponding to a band gap energy of 2.10 eV, and the emitter layer of the upper solar subcell is composed of $(In_xGa_{1-x})_{1-y}Al_yP$ where x is 0.505, and y is 0.107, corresponding to a band gap of 2.05 eV.

In some implementations, the multijunction solar cell includes a third solar subcell disposed below the lower solar subcell, and a grading layer disposed between the lower solar subcell and the third solar subcell. The grading interlayer is compositionally step-graded with between one and four steps and is composed of $In_xGa_{1-x}As$ or $(In_xGa_{1-x})_yAl_{1-y}As$ with 0<x<1, 0<y<1, and x and y selected such that the band gap energy is in the range of 1.15 to 1.41 eV throughout its thickness. In some instances, the grading interlayer has a graded band gap energy in the range of 1.2 to 1.35 eV.

In some implementations, either (i) the emitter layer; or (ii) the base layer and emitter layer, of the upper solar subcell have different lattice constants from the lattice constant of the lower solar subcell. In some implementations, a lattice constant of each pair of alternating layers increases over a lattice constant of the growth substrate.

In some implementations, a multijunction solar cell includes an upper solar subcell, a first graded-index reflector structure, and a lower solar subcell. The upper solar subcell has an emitter layer and a base layer forming a photoelectric junction. The first graded-index reflector structure is disposed beneath the base layer of the upper solar subcell. The first graded-index reflector structure includes a first plurality of pairs of alternating layers, a second plurality of pairs of alternating layers, and a third plurality of pairs of alternating layers. The first plurality of pairs of alternating layers are of $In_yAl_xGa_{(1-x-y)}As$ and a first different semiconductor material, wherein 0<x<1, 0≤y≤0.3, and a mole fraction of aluminum is increased for each of the $In_yAl_xGa_{(1-x-y)}As$ layers in the first plurality of pairs of alternating layers as the distance between the alternating layers and the upper solar subcell increases. The second plurality of pairs of alternating layers are of $In_yAl_xGa_{(1-x-y)}As$ and a second different semiconductor material, wherein 0<x<1, 0≤y≤0.3, and a mole fraction of aluminum repeats for each of the $In_yAl_xGa_{(1-x-y)}As$ layers in the second plurality of pairs of alternating layers as the distance between the alternating layers and the upper solar subcell increases. The third plurality of pairs of alternating layers of are $In_yAl_xGa_{(1-x-y)}As$ and a third different semiconductor material, wherein 0<x<1, 0≤y≤0.3, and a mole fraction of aluminum is decreased for each of the $In_yAl_xGa_{(1-x-y)}As$ layers in the third plurality of pairs of alternating layers as the distance between the alternating layers and the upper solar subcell increases. The lower solar subcell is disposed beneath the first graded-index reflector structure, and the lower solar subcell has an emitter layer and a base layer forming a photoelectric junction.

A method of fabricating a multijunction solar cell can include, in accordance with some implementations, forming an upper solar subcell having an emitter layer and a base layer that form a photoelectric junction, wherein the base layer has a bottom surface. The method also can include forming a lower solar subcell having an emitter layer and a base layer that form a photoelectric junction. The method further can include forming a reflector structure using successive layers with a changing or graded index of refraction disposed above the emitter layer of the lower solar subcell and beneath the base layer of the upper solar subcell. Forming the reflector structure can include forming a first plurality of pairs of alternating layers and forming a second plurality of pairs of alternating layers. The first plurality of pairs of alternating layers are of $In_yAl_xGa_{(1-x-y)}As$ and a first different semiconductor material, wherein $0<x<1$, and $0<y\leq0.3$ and a mole fraction of aluminum is increased for each of the $In_yAl_xGa_{(1-x-y)}As$ layers in the first plurality of pairs of alternating layers as the distance between the surface of the alternating layers and the bottom surface of the upper solar subcell increases. The second plurality of pairs of alternating layers are of $In_yAl_xGa_{(1-x-y)}As$, and a second different semiconductor material, $0<x<1$, and $0<y\leq0.3$, wherein a mole fraction of aluminum is decreased, for each of the plurality of pairs of $In_yAl_xGa_{(1-x-y)}As$ layers in the second plurality of pairs of alternating layers, as the distance between the surface of the alternating layers and the bottom surface of the upper solar subcell increases.

As illustrated in FIG. 9, an antireflective (ARC) dielectric coating layer 163 is disposed over the entire surface of the upper surface of subcell A including over the grid lines 162. As illustrated in FIG. 9, a cover glass 165 is attached to the upper surface of the multijunction solar cell by adhesive 164.

In some embodiments, the multijunction solar cell is an upright multijunction solar cell. In some embodiments, the multijunction solar cell is an upright metamorphic multijunction solar cell. In some embodiments, multijunction solar cell is an inverted metamorphic solar cell.

There can be practical reasons for not including graded-index reflector structures below high bandgap subcells. In some embodiments, a properly designed reflector may be comprised of materials that have slightly higher bandgap energy than the material above. For example, for an upper (In)GaAs subcell with bandgap energy 1.41 eV, a $Al_{0.15}Ga_{0.85}As$ layer with a bandgap energy of 1.61 eV as the lowest bandgap material in the reflector may be used. Otherwise, the reflector may absorb the incident light that is desired to be reflected. In some embodiments, for high bandgap materials like InGaP at 1.9 eV, materials are 2.0 eV and higher. In the III-V material system lattice matched to GaAs, bandgap energies only go up to approximately 2.3 eV. In some embodiments, the graded-index reflector structure could be made from AlInGaP and InAlP. However, the change in index of refraction could be only 0.2 between the two materials, making both the bandwidth narrow and the required number of pairs high.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof. The disclosed embodiments are presented for purposes of illustration and not limitation.

What is claimed is:

1. A multijunction solar cell comprising:
   an upper solar subcell having an emitter layer and a base layer forming a photoelectric junction, the base layer having a bottom surface;
   a first graded-index reflector structure disposed beneath the base layer of the upper solar subcell, wherein the first graded-index reflector structure comprises:
      a first plurality of pairs of alternating layers of $In_yAl_xGa_{(1-x-y)}As$ and a first different semiconductor material, wherein $0<x<1$, and $0<y\leq0.3$ and a mole fraction of aluminum is increased for each of the $In_yAl_xGa_{(1-x-y)}As$ layers in the first plurality of pairs of alternating layers as the distance between the surface of the alternating layers and the bottom surface of the upper solar subcell increases; and
      a second plurality of pairs of alternating layers of $In_yAl_xGa_{(1-x-y)}As$, and a second different semiconductor material, $0<x<1$, and $0<y\leq0.3$ wherein a mole fraction of aluminum is decreased, for each of the plurality of pairs of $In_yAl_xGa_{(1-x-y)}As$ layers in the second plurality of pairs of alternating layers, as the distance between the surface of the alternating layers and the bottom surface of the upper solar subcell increases; and
   the multijunction solar cell further comprises a lower solar subcell disposed beneath the first graded-index reflector structure, wherein the lower solar subcell has an emitter layer and a base layer forming a photoelectric junction.

2. The multijunction solar cell of claim 1 further comprising a second graded-index reflector structure disposed beneath the base layer of the lower solar subcell;
   wherein the second graded-index reflector structure is constructed such that (i) at least a portion of light of a first spectral wavelength range that enters and passes through the lower solar subcell is reflected back into the lower solar subcell by the second graded-index reflector structure; and (ii) at least a portion of light of a second spectral wavelength range that enters and passes through the lower solar subcell is transmitted through the second graded-index reflector structure to layers disposed beneath the second graded-index reflector structure, wherein the second spectral wavelength range is composed of greater wavelengths than the wavelengths of the first spectral wavelength range.

3. The multijunction solar cell of claim 1, wherein the band gap energy of the first graded-index reflector structure is greater than the band gap energy of the upper solar subcell, and the first graded-index reflector structure is composed of materials that form an optical wavelength reflector structure and the materials are selected and constructed such that (i) at least a portion of light of a first spectral wavelength range that enters and passes through the upper solar subcell is reflected back into the upper solar subcell by the first graded-index reflector structure; (ii) at least a portion of light of a second spectral wavelength range that enters and passes through the upper solar subcell is transmitted through the first graded-index reflector structure to layers disposed beneath the first graded-index reflector structure, wherein the second spectral wavelength range is composed of greater wavelengths than the wavelengths of the first spectral wavelength range so that photons of the first spectral wavelength range which have not been absorbed by the upper solar subcell are reflected back into the upper solar subcell for possible absorption therein, thereby increasing the efficiency of the upper solar subcell.

4. The multijunction solar cell of claim 1, wherein the lower solar subcell is composed of germanium and forms a growth substrate of the multijunction solar cell.

5. The multijunction solar cell of claim 4, further comprising a buffer layer disposed between the growth substrate and the first graded-index reflector structure.

6. The multijunction solar cell of claim 1, wherein the increase in mole fraction of aluminum in the $In_yAl_xGa_{(1-x-y)}As$ layer in the first plurality of pairs of alternating layers ranges from 20% to 90%.

7. The multijunction solar cell of claim 6, wherein the second different semiconductor material is $InAl_xGa_{1-x}As$, where $0 < x < 0.16$.

8. The multijunction solar cell as defined in claim 1, wherein the solar cell is a four junction solar cell comprising four solar subcells including the upper solar subcell and the lower solar subcell, and the average band gap energy of all four subcells is equal to or greater than 1.35 eV.

9. The multijunction solar cell as defined in claim 1, wherein the upper solar subcell is composed of indium gallium aluminum phosphide, and the emitter layer of the lower solar subcell is composed of indium gallium phosphide or aluminum indium gallium arsenide, and the base layer of the lower solar subcell is composed of aluminum indium gallium arsenide, wherein the lower solar subcell has a band gap energy in the range of 1.55 to 1.8 eV.

10. The multijunction solar cell as defined in claim 9, further comprising a third solar subcell disposed below the lower solar subcell, the third solar subcell being composed of indium gallium arsenide and has a third band gap less than that of the lower solar subcell and is lattice matched with the lower solar subcell.

11. The multijunction solar cell as defined in claim 10, wherein the upper solar subcell has a band gap energy of less than 2.15, the lower solar subcell has a band gap energy of less than 1.73 eV; and the third solar subcell has a band gap energy in the range of 1.15 to 1.2 eV.

12. The multijunction solar cell as defined in claim 1, wherein the base layer of the upper subcell is composed of $(In_xGa_{1-x})_{1-y}Al_yP$ where x is 0.505, and y is 0.142, corresponding to a band gap energy of 2.10 eV, and the emitter layer of the upper solar subcell is composed of $(In_xGa_{1-x})_{1-y}Al_yP$ where x is 0.505, and y is 0.107, corresponding to a band gap of 2.05 eV.

13. The multijunction solar cell as defined in claim 1, further comprising a third solar subcell disposed below the lower solar subcell, and further comprising a grading layer disposed between the lower solar subcell and the third solar subcell, wherein the grading interlayer is compositionally step-graded with between one and four steps and is composed of $In_xGa_{1-x}As$ or $(In_xGa_{1-x})_yAl_{1-y}As$ with $0 < x < 1$, $0 < y < 1$, and x and y selected such that the band gap energy is in the range of 1.15 to 1.41 eV throughout its thickness.

14. The multijunction solar cell as defined in claim 13, wherein the grading interlayer has a graded band gap energy in the range of 1.2 to 1.35 eV.

15. The multijunction solar cell as defined in claim 1, wherein either (i) the emitter layer; or (ii) the base layer and emitter layer, of the upper solar subcell have different lattice constants from the lattice constant of the lower solar subcell.

16. A multijunction solar cell as defined in claim 4, wherein a lattice constant of each pair of alternating layers increases over a lattice constant of the growth substrate.

17. The multijunction solar cell of claim 1, wherein the multijunction solar cell is an upright multijunction solar cell, an upright metamorphic multijunction solar cell, or an inverted metamorphic multijunction solar cell.

18. A multijunction solar cell comprising:
an upper solar subcell having an emitter layer and a base layer forming a photoelectric junction;
a first graded-index reflector structure disposed beneath the base layer of the upper solar subcell, wherein the first graded-index reflector structure comprises:
a first plurality of pairs of alternating layers of $In_yAl_xGa_{(1-x-y)}As$ and a first different semiconductor material, wherein $0<x<1$, $0 \leq y \leq 0.3$, and a mole fraction of aluminum is increased for each of the $In_yAl_xGa_{(1-x-y)}As$ layers in the first plurality of pairs of alternating layers as the distance between the alternating layers and the upper solar subcell increases,
a second plurality of pairs of alternating layers of $In_yAl_xGa_{(1-x-y)}As$ and a second different semiconductor material, wherein $0<x<1$, $0 \leq y \leq 0.3$, and a mole fraction of aluminum repeats for each of the $In_yAl_xGa_{(1-x-y)}As$ layers in the second plurality of pairs of alternating layers as the distance between the alternating layers and the upper solar subcell increases; and
a third plurality of pairs of alternating layers of $In_yAl_xGa_{(1-x-y)}As$ and a third different semiconductor material, wherein $0<x<1$, $0 \leq y \leq 0.3$, and a mole fraction of aluminum is decreased for each of the $In_yAl_xGa_{(1-x-y)}As$ layers in the third plurality of pairs of alternating layers as the distance between the alternating layers and the upper solar subcell increases;
a lower solar subcell disposed beneath the first graded-index reflector structure, wherein the lower solar subcell has an emitter layer and a base layer forming a photoelectric junction.

19. A method of fabricating a multijunction solar cell comprising:
forming an upper solar subcell having an emitter layer and a base layer that form a photoelectric junction, the base layer having a bottom surface;
forming a lower solar subcell having an emitter layer and a base layer that form a photoelectric junction; and
forming a reflector structure using successive layers with a changing or graded index of refraction disposed above the emitter layer of the lower solar subcell and beneath the base layer of the upper solar subcell, wherein forming the reflector structure includes:
forming a first plurality of pairs of alternating layers of $In_yAl_xGa_{(1-x-y)}As$ and a first different semiconductor material, wherein $0<x<1$, and $0<y \leq 0.3$ and a mole fraction of aluminum is increased for each of the $In_yAl_xGa_{(1-x-y)}As$ layers in the first plurality of pairs of alternating layers as the distance between the surface of the alternating layers and the bottom surface of the upper solar subcell increases; and
forming a second plurality of pairs of alternating layers of $In_yAl_xGa_{(1-x-y)}As$, and a second different semiconductor material, $0<x<1$, and $0<y \leq 0.3$ wherein a mole fraction of aluminum is decreased, for each of the plurality of pairs of $In_yAl_xGa_{(1-x-y)}As$ layers in the second plurality of pairs of alternating layers, as the distance between the surface of the alternating layers and the bottom surface of the upper solar subcell increases.

* * * * *